United States Patent [19]
Scifres et al.

[11] Patent Number: 4,716,568
[45] Date of Patent: Dec. 29, 1987

[54] STACKED DIODE LASER ARRAY ASSEMBLY

[75] Inventors: Donald R. Scifres, San Jose; Peter Cross, Palo Alto; Gary L. Harnagel, San Jose, all of Calif.

[73] Assignee: Spectra Diode Laboratories, Inc., San Jose, Calif.

[21] Appl. No.: 859,058

[22] Filed: May 1, 1986

Related U.S. Application Data

[63] Continuation-in-part of Ser. No. 731,651, May 7, 1985, abandoned.

[51] Int. Cl.4 .................................................. H01S 3/04
[52] U.S. Cl. ........................................ 372/36; 357/17; 357/76; 357/81
[58] Field of Search ............... 372/36, 44, 50; 357/17, 357/81, 76

[56] References Cited

U.S. PATENT DOCUMENTS

| | | | |
|---|---|---|---|
| 3,351,698 | 11/1967 | Marinace | 174/15 |
| 3,538,455 | 11/1970 | Florio | 331/94.5 |
| 3,555,452 | 1/1971 | Nielsen et al. | 331/94.5 |
| 3,622,906 | 11/1971 | Nyul | 331/94.5 |
| 3,878,556 | 4/1975 | Nyul | 357/81 |
| 3,962,655 | 6/1976 | Selway et al. | 372/36 |
| 4,393,393 | 7/1983 | Allen et al. | 357/81 |
| 4,454,602 | 6/1984 | Smith | 372/36 |
| 4,627,062 | 12/1986 | Bender | 372/36 |

OTHER PUBLICATIONS

Henry Kressel et al., "Semiconductor Lasers and Heterojunction LEDs", published 1977, New York, pp. 456–457.

A. M. Patlach, IBM Technical Disclosure Bulletin, vol. No. 2, Jul. 1970, pp. 337–338, "Laser Packaging".

R. L. Gamblin, "Coherent GaAs Array Light Source", IBM Technical Disclosure Bulletin, vol. 12, No. 4, Sep. 1969, pp. 580–581.

Primary Examiner—James W. Davie
Attorney, Agent, or Firm—Thomas Schneck

[57] ABSTRACT

A diode laser array assembly made from a plurality of linear diode laser array subassemblies stacked one above the other. Each subassembly is an array of individual laser beam emitters, such as a laser bar, mounted on a support plate. An electrically conductive path goes from one major surface of a support plate, through the linear laser array, to an opposite major surface of the support plate. Each subassembly is connected physically and electrically to adjacent subassemblies to form the final assembly. In one embodiment, the support plates are electrically insulating and partly coated or covered with conducting material. The plates are either rectangular with projections and directly connected, rectangular with metal plates between each other, or rectangular and connected in a staircase configuration. Alternatively, the support plates may be electrically conducting with an insulating layer and a conducting layer disposed in a sandwich configuration. The plates may also be made up of an electrically insulating support plate and an electrically conducting spacer plate.

20 Claims, 9 Drawing Figures

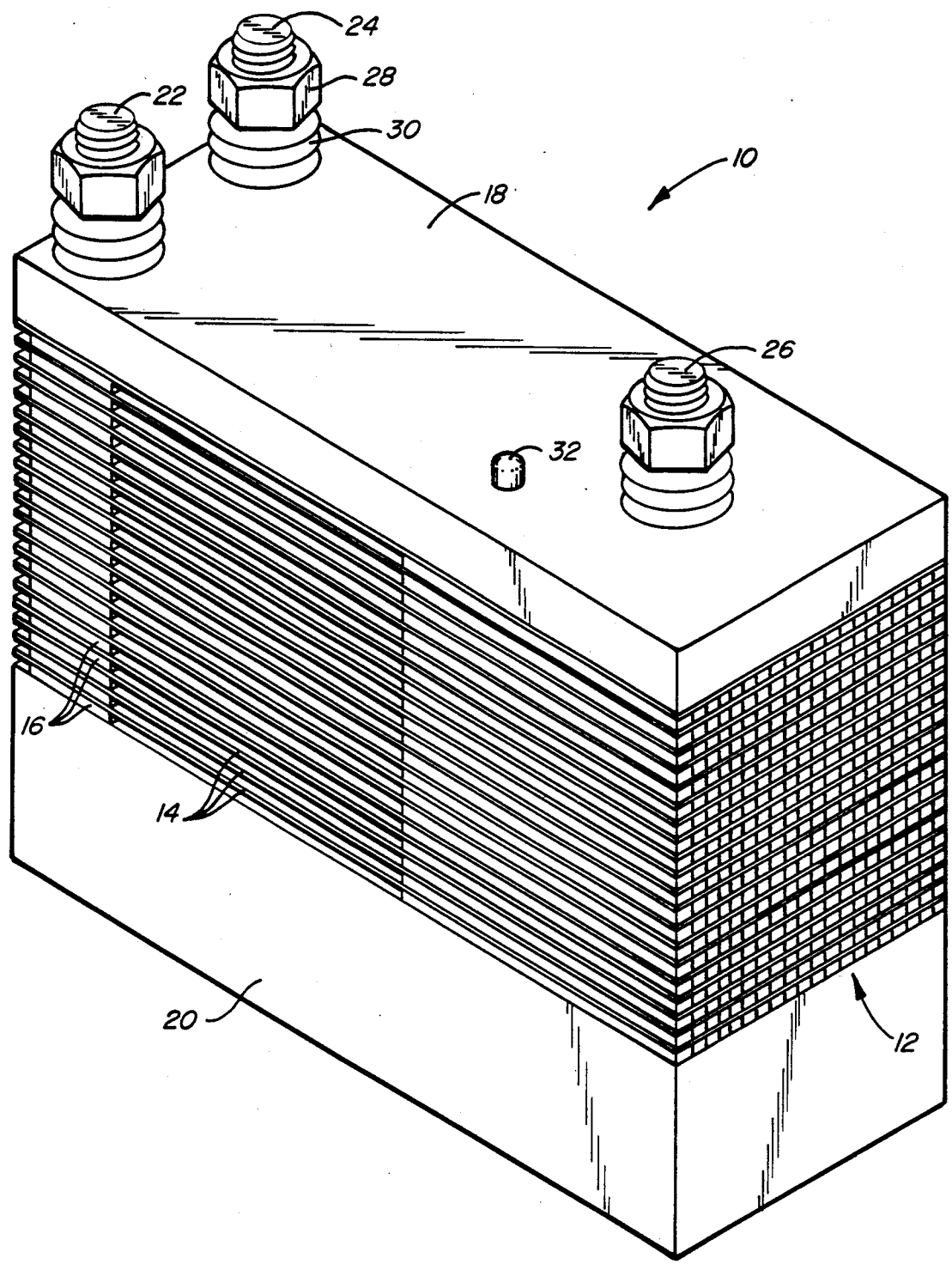
FIG._1.

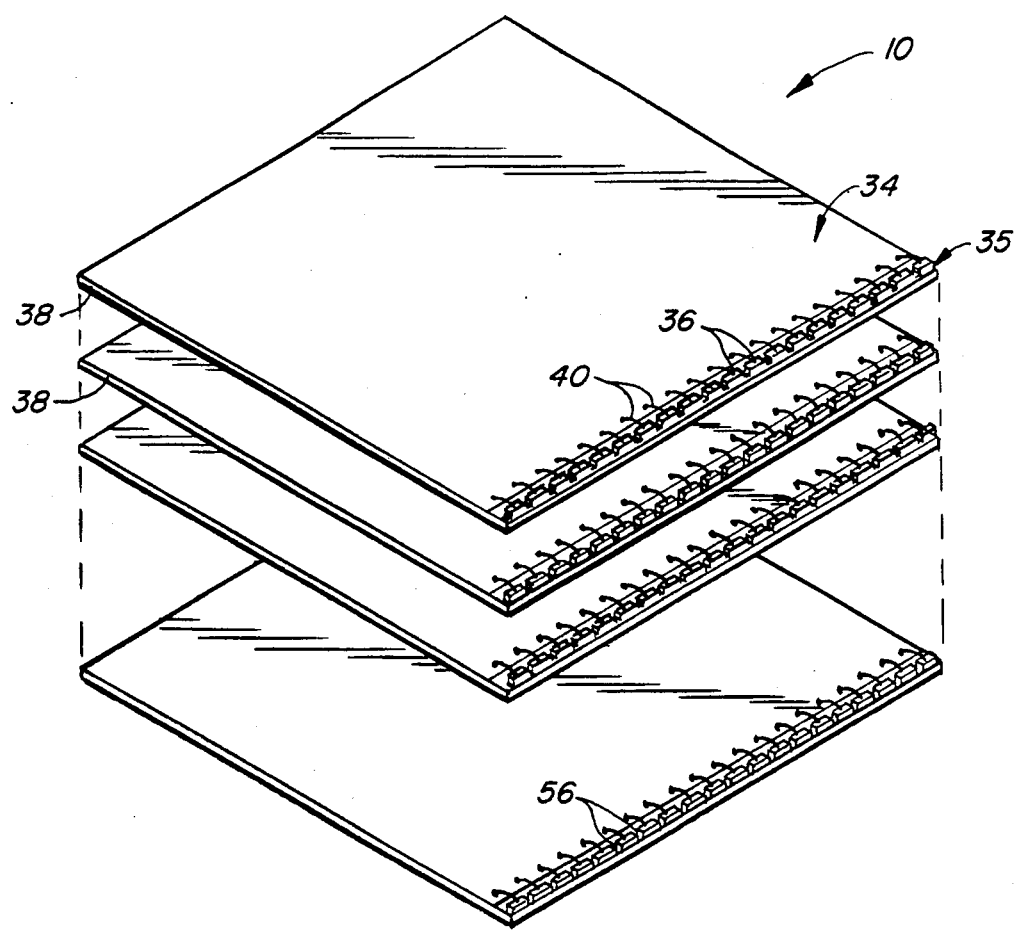
FIG._2.
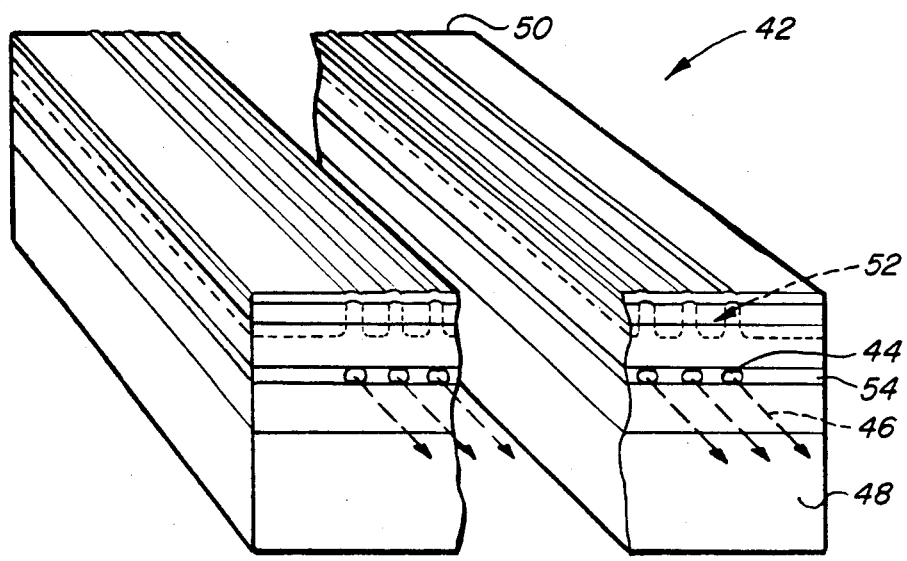
FIG._3.

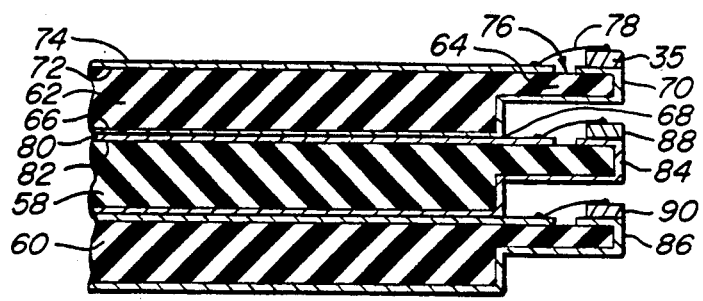
FIG._4.
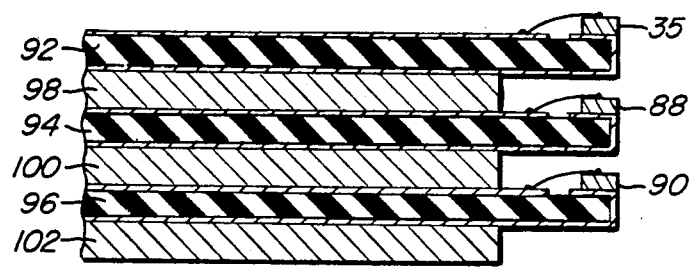
FIG._5.
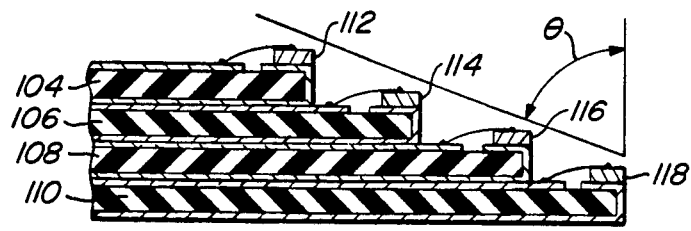
FIG._6.
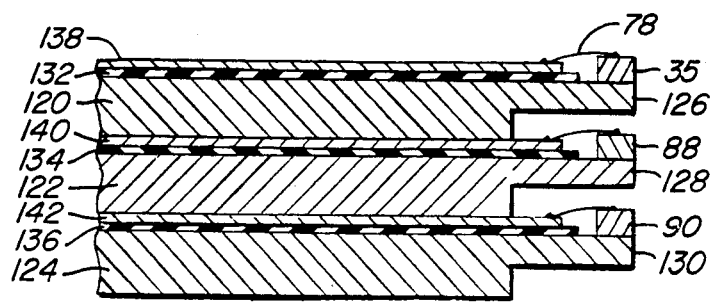
FIG._7.

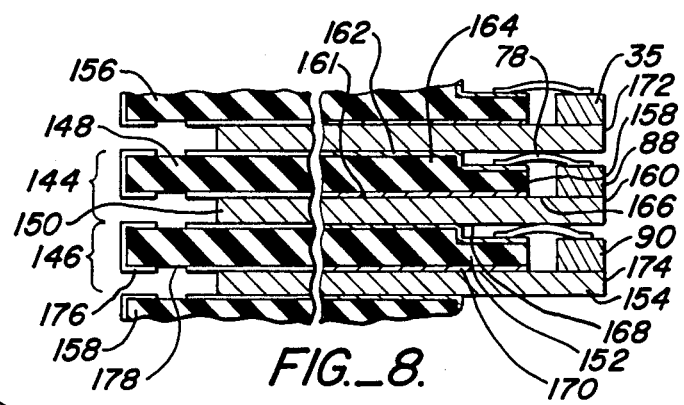
FIG._8.
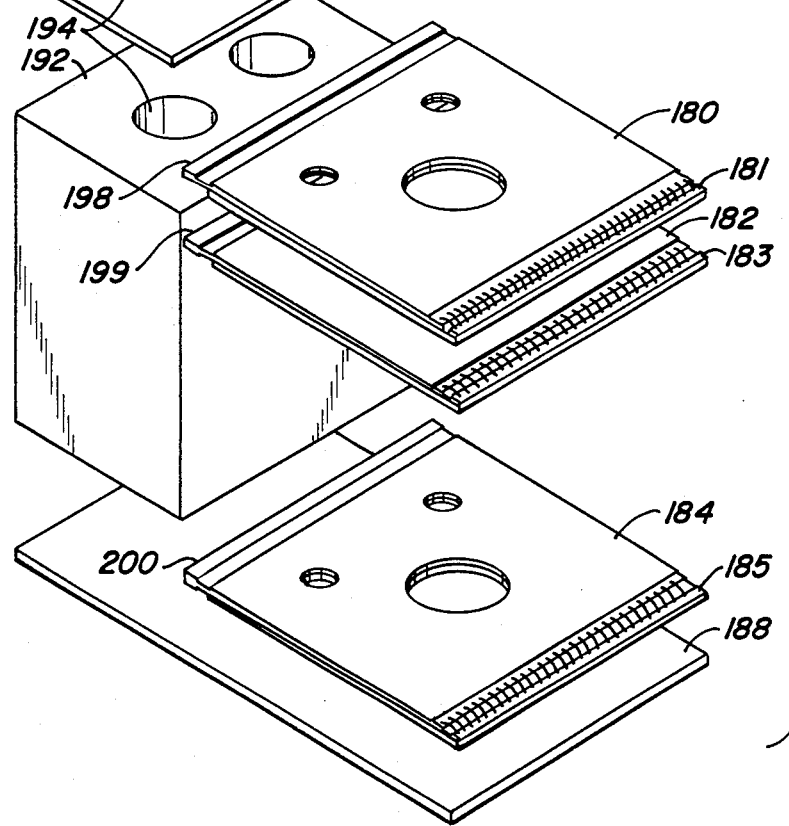
FIG._9.

4,716,568

STACKED DIODE LASER ARRAY ASSEMBLY

STATEMENT AS TO RIGHTS TO INVENTIONS MADE UNDER FEDERALLY-SPONSORED RESEARCH AND DEVELOPMENT

This invention was made with Government support under contract N66001-85-C-0162 awarded by the Department of the Navy. The Government has certain rights in this invention.

CROSS REFERENCE TO RELATED APPLICATION

This application is a continuation-in-part of prior copending application Ser. No. 731,651 filed May 7, 1985, now abandoned.

TECHNICAL FIELD

The present invention relates to diode laser arrays and in particular to two-dimensional array structures assembled from individual diode lasers.

BACKGROUND ART

In U.S. Pat. No. 4,454,602 to Smith, a laser diode stacked array is disclosed in which a plurality of alternating first and second plate assemblies are stacked so that laser diodes mounted in the first plate assemblies form a linear array. The second assembly has electric contact spacers for electrically connecting the diodes in series and thermally conducting heat sink spacers. Each individual laser diode is mounted in first plate assembly as in U.S. Pat. No. 4,393,393 to Allen et al. The diodes are mounted between two conductive plates with a flexible spacer also positioned between the plates to eliminate mechanical strain on the diode due to diode heating.

Two-dimensional laser diode arrays may be used for optical pumping of Nd:YAG lasers. In order to satisfy the optical pumping requirements of many Nd:YAG lasers an array that delivers a power of at least one kilowatt per square centimeter is desired. Totally integrated two-dimensional arrays are being developed, but they have not been completely built to date. Two-dimensional array structures are thus desired that can be assembled from existing components, such as individual diode lasers. Such a structure would have to provide for waste heat removal, mechanical integrity, and electrical interconnection. Further, the components should be easily manufactured and assembled. Because of the large number of components in a complete assembly, the structures should be testable before the assembly is completed.

Accordingly, it is an object of the invention to provide two-dimensional array structures of diode lasers and a method for their assembly that meets the above requirements.

DISCLOSURE OF THE INVENTION

The above object has been met with a laser array assembly in which a plurality of linear diode laser array subassemblies are stacked one above the other. Each linear array subassembly is in turn made up of individual laser emitters mounted in thermal communication with a thermally conductive plate. An electrically conductive path goes from the one surface of a plate, through the diode laser linear array, to the opposite surface of the plate. Each of the subassemblies is then electrically connected to adjacent subassemblies. Thus, each of the linear array subassemblies can be tested individually before they are assembled together to make the laser array.

Waste heat is removed from the linear array subassemblies by high thermal conductivity plates that extend into fins. The heat conducting plates may either be the same plates supporting the laser array or adjacent spacer plates.

Several different ways of stacking the subassemblies are possible. In one embodiment, electrically insulating, heat conducting plates have electrically conducting material applied thereto and are stacked directly upon one another. The plates are shaped so that the front ends of the plates are spaced apart for containing the laser diode linear arrays.

The electrically conducting layer covers the entire bottom surface of each plate and wraps around the front edge to connect to the bottom electrode of the laser diodes on the plate. The electrically conducting layer covers part of the top surface of each plate and connects via a wire to the top electrode of the laser diodes on the plate.

A second embodiment replaces the shaped electrically insulating plates with flat electrically insulating plates. In this case, the plates are spaced apart by electrically conducting spacer plates that also serve to remove waste heat. In a third embodiment, flat electrically insulating support plates are not spaced apart, but placed directly upon one another. In this embodiment, the front edges of the plates do not coincide, but rather each plate is spaced back from the plate beneath it. The resulting 2-D array is thus at an angle from the vertical.

A fourth embodiment uses shaped electrically conducting plates instead of coated electrically insulating plates. The top surface of the plates is partly covered with an insulating material layer, which in turn is partly covered with a conducting material layer. The laser array is bonded to the front end of the plate with its bottom electrodes connected directly to the conducting plate. The top electrodes of the laser array are connected by wires to the conducting material coating layer.

A fifth embodiment uses plates made up of a first electrically insulating subplate and a second electrically conducting subplate. An electrically conducting layer is applied to the top surface of the first sub-plate. The laser array is bonded to the front end of the second subplate. The first subplate is set back from the second subplate and extends back into fins. Wires connect the conducting layer to the laser array.

An advantage of the present invention is that it is easily manufactured and assembled, and testable before completion of the assembly. The plates are easily covered with conducting or insulating material using well-known application processes. Because bonding occurs on only one side of each laser diode, the subassemblies avoid heat-related mechanical strain on the diodes and are easier to construct than the mounting of diode lasers and flexible spacers between pairs of conductive plates.

BRIEF DESCRIPTION OF THE DRAWINGS

FIG. 1 is a perspective view of a two-dimensional diode laser array assembly of the present invention.

FIG. 2 is a schematic of a stack of linear subassemblies to form the assembly in FIG. 1.

FIG. 3 is a broken-away perspective view of a linear diode laser array for use in the subassembly of FIG. 2.

FIG. 4 is a side sectional view of a first stacking embodiment of the present invention.

FIG. 5 is a side sectional view of a second stacking embodiment of the present invention.

FIG. 6 is a side sectional view of a third stacking embodiment of the present invention.

FIG. 7 is a side sectional view of a fourth stacking embodiment of the present invention.

FIG. 8 is a side sectional view of a fifth stacking embodiment of the present invention.

FIG. 9 is an exploded view of a two-dimensional diode laser array assembly using the stacking embodiment of FIG. 8.

BEST MODES FOR CARRYING OUT THE INVENTION

With reference to FIG. 1, a diode laser array assembly 10 emits laser light from an emitting face or two-dimensional array 12 of diode lasers at a front end of the assembly. The emitting face 12 is typically 1 cm by 1-2 cm, while the length of assembly 10 is about 2.5 cm. Cooling fins 14 extend back from the front end of assembly 10. Electrically insulating spacers 16 at a back end of assembly 10 separate adjacent fins 14. Thermally radiative fins 14 remove waste heat produced by the diode laser array 12 by conduction and liquid or gas flow between the fins. The fins 14 are typically made of copper but may also be any other strong heat conducting material. The effective aperture for liquid or gas flow through the fins is about 1 cm by 1 cm.

The entire assembly 10 is held together by top and bottom mounting plates 18 and 20. Mounting plates 18 and 20 may also serve as primary or supplementary heat sinks. Top and bottom mounting plates may be bolted together and to the rest of assembly 10 by bolts 22, 24 and 26. Each bolt has a nut 28 screwed thereto over a spring 30, which is thereby compressed. One or more pins 32 maintain the components of the front end of assembly 12 in proper alignment. Holes in the subassemblies, seen in FIG. 2, receive bolt 26 and pins 32. Alternatively, assembly 10 is soldered together.

In FIG. 2, assembly 10 can be seen to be made up of a plurality of subassemblies 34 stacked one above the other. A typical assembly has about 10 to 50 sub-assemblies. Each subassembly 34 is in turn made up of a linear array 35 of individual laser emitters 36 mounted on the front end of a support plate 38. Not shown in FIG. 2 are the conducting spacer plates required to provide clearance for the diode linear array. Plates 38 are usually made of heat conducting material such as BeO. $Al_2O_3$, SiC and other ceramic materials can also be used. Each plate 38 is typically 150 microns thick. Such a plate is then covered with an electrically conductive material such as Au, Pt, Ag, Ti or other metal or metallic alloy. Preferably, the layer covers the bottom surface, front edge, and most of the top surface of each plate 38. It is important that top and bottom surfaces of plate 38 be electrically insulated from each other to avoid a short circuit. An electrically conductive path goes from the top surface of plate 38, through wires 40, through linear array 35, to the bottom surface of plate 38 via the coating on the front edge of plate 38. The voltage between top and bottom surfaces of plate 38 is typically about 2 volts.

Linear array 35 is made from diode laser bars about one centimeter long, 75 microns thick, and 250 microns between cleaved mirror facets. Several shorter length bars may also be mounted on the heat sink. One type of laser bar that may be used is shown in FIG. 3. Other kinds of laser bars may be used for linear array 35. Laser bar 42 has a plurality of individual emitters 44 that emit laser beams 46 from a front mirror facet 48. A rear mirror facet 50 is usually made to be highly reflective by applying a reflective coating. Laser bar 42 is typically divided by proton bombarded regions 52 in the topmost layers of the bar 42. Current is channeled between the bombarded regions 52, which are insulating, to the active region 54. Typically, laser bar 42 is divided into about 20 sections by saw cuts, 56 in FIG. 2, to suppress transverse laser oscillation. Etching v-groove or other means may also be used for this purpose. A construction for a laser bar is described in U.S. Pat. Re. No. 31,806 to Scifres et al., incorporated by reference herein.

There are several ways in which linear subassemblies 34 may be stacked upon one another to form assembly with two-dimensional laser array 12. In particular, five ways will be discussed with respect to FIGS. 4-8. The stacked assemblies in FIGS. 4 and 8 are preferred.

In FIG. 4, a shaped electrically insulating support plate 58 is stacked upon another electrically insulating support plate 60. Plate 58 is stacked upon by an electrically insulating support plate 62. Plate 62 is generally rectangular in shape with a projection 64 sticking out of the front end of the plate 62. Typically, plate 62 is 1 cm by 1 cm by 250 microns with a projection 64 that is 150 microns thick.

Plate 62 has a bottom major surface 66 that has an electrically conducting layer 68 applied thereto. Layer 68 generally covers the entire bottom major surface 66 including the underside of projection 64. Layer 68 wraps around the front edge 70 of projection 64 to the top of the projection. There, layer 68 makes electrical contact with the bottom electrode of linear laser array 35, which is bonded to this coating 70 near the front edge of projection 64.

Plate 62 also has a top major surface 72 that is partly covered with another electrically conducting layer 74 applied thereto. Layer 74 generally covers top major surface except for a strip 76 of uncovered plate adjacent to laser array 35. This strip keeps layer 74 electrically isolated from layer 68, which wraps around front edge 70 to the surface beneath laser array 35. A plurality of wires 78 electrically connect layer 74 to the top electrode of linear laser array 35.

Layer 68 on the bottom major surface 66 of plate 62 is in physical and electrical contact with a layer 80 on the top major surface 82 of plate 58. Similarly, plate 58 is in contact with plate 60. These plates may then be soldered together. Plates 58, 60 and 62 are disposed so that their front edges 70, 84 and 86 are vertically aligned. Linear laser arrays 35, 88 and 90 are similarly vertically aligned. Preferably, plates 58, 60 and 62 are heat conducting as well as electrically insulating for removing waste heat from diode arrays 35, 88 and 90. Only three subassemblies are shown but additional subassemblies can be added beneath plate 60. Each plate 58, 60, or one not shown, is identical to plate 62 discussed above except that some may extend into thermally radiative fins if the plate material, discussed with reference to FIG. 2, is strong enough.

Laser array 88 makes physical contact with plate 58, to which it is bonded, but not with projection 64 of plate 62. Thus, large mechanical stresses on the array 88 because of heat induced expansion are avoided. Projection 64 is formed by notching the front end of bottom major surface 66 of plate 62. Since the top major surface 72 is substantially planar with no topography, it can be polished by standard means to provide a flat, smooth interface for bonding laser array 35 to the top of projection 64. The gap between the top of laser array 88 and projection 64 is typically 25 microns, taking the wire ribbon and conducting layers into account. An accidental short across this gap is unimportant since both sides of the gap are at the same electrical potential.

The stacked assembly of FIG. 5 is identical to that of FIG. 4 except that support plates 92, 94 and 96 are not physically connected. Metallic or other electrically conducting spacers 98, 100 and 102 physically separate but electrically connect adjacent plates together. Support plates 92, 94 and 96 are of one type, i.e. insulative with electrically conductive layers applied to portions of top and bottom major surfaces of the plates, while spacers 98, 100 and 102 are of the opposite electrical conductivity type, i.e. conductive. Spacers and plates may be soldered together. Each plate 92, 94 and 96 is generally about 150 microns thick and extends forward beyond spacers 98, 100 and 102. Spacers 98, 100 and 102 are generally about 100 microns thick so as to be thicker than diode arrays 35, 88 and 90 bonded to the plates. Thus, a gap exists between the top of laser array 88, for example, and the bottom surface of plate 92. Some of the spacers 98, 100 and 102 may be extended back into a cooling fin structure, shown in FIG. 1, for removing waste heat.

In FIG. 6, support plates 104, 106, 108 and 110 are stacked on top of each other in a stair-step arrangement. These plates 104, 106, 108 and 110 are shaped and coated like plates 92, 94 and 96 in FIG. 5 except that the plates are translated horizontally as one moves up the stack. Unlike FIG. 5, however, there are no metallic spacers 98, 100 and 102. Preferably, the plates 104, 106, 108, 110 are heat conducting as well as electrically insulating so that heat sinks, like top and bottom mounting plates 18 and 20, may draw away waste heat from laser arrays 112, 114, 116 and 118. Linear laser arrays 112, 114, 116 and 118 are bonded near the front edge to the top surface of plates 104, 106, 108 and 110 respectively. Because the plates are not aligned vertically, but rather are progressively translated, the lasers are aligned in a plane that is at an angle θ to the vertical direction.

The staircase stacking of subassemblies allows for a higher vertical stacking density than the stacking alternatives of FIGS. 4 and 5. The vertical density is limited, however, to about twice the vertical density of the other stacking alternatives. The full-width-at-half-maximum divergence angle of a typical laser array is about 35 degrees, so if the reclining angle θ exceeds about 45 degrees, laser light from one laser array may hit the next lower array in front of it. For example, laser light from laser array 112 may hit the back of laser array 114.

In FIG. 7, shaped electrically conducting support plates 120, 122 and 124 are used instead of the shaped electrically insulating plates 58, 60 and 62 of FIG. 4. Plates 120, 122 and 124 are generally rectangular in shape with projections 126, 128 and 130 sticking out of the front end of plates 120, 122 and 124. Typically, the thickness of plates 120, 122 and 124 is about 250 microns and the thickness of the projections 126, 128 and 130 is about 150 microns. Thus, in shape, plates 120, 122 and 124 are identical to plates 58, 60 and 62 in FIG. 4.

Electrically insulating layers 132, 134 and 136 are disposed on the top major surface of plates 120, 122 and 124. The layers 132, 134 and 136 do not cover the entire top surface of the plates but stop short of linear laser arrays 35, 88 and 90, which are bonded to the front end of projection 126, 128 and 130 respectively. The insulating layer used may be $Al_2O_3$, $SiO_2$, $Si_3N_4$ or other insulator and is generally only about one micron thick. If in addition the layer is made optically transparent and somewhat thicker (25-100 $\mu$m), it functions as an optical waveguide that can sample the light emitted from the back facet of the laser bar for monitoring or control purposes Electrically conducting layers 138, 140 and 142 are applied to the top of insulating layers 132, 134 and 136 respectively. The conducting layers generally stop short of the front edge of the insulating layers to avoid shorting with plates 120, 122 and 124. The conducting layers are typically Ti, Pt, Au or Ag and are about 3 microns thick. A plurality of wires 78 electrically connect layers 138, 140 and 142 to the top electrodes of linear laser array 35, 88 and 90.

Plates 120, 122 and 124 are bonded together as in FIG. 4, with linear arrays 35, 88 and 90 vertically aligned and gaps between the tops of linear arrays 88 and 90 and the bottom of projections 126 and 128. As in FIG. 4, only three subassemblies are shown, but the assembly may have additional subassemblies added beneath plate 124. Some of the plates 120, 122, 124 and others not shown can be extended back into a cooling fin structure, as seen in FIG. 1. The plates 120, 122, 124 are heat conducting as well as electrically conducting to draw away waste-heat from diode arrays 35, 88 and 90.

In FIG. 8, a plate 144 is stacked upon another plate 146. Plate 144 is made up of a wirebonding or first spacer subplate 148 and a bar-mounting or second support subplate 150. Likewise, plate 146 is made up of first and second subplates 152 and 154. Only two complete subassemblies are shown, but additional subassemblies can be added above plate 144 and beneath plate 146. Portions of additional subassemblies 156 and 158 can be seen in FIG. 8. First or spacer subplate 148 is mounted on second or support subplate 150 with a front edge 158 of first subplate 148 spaced back from a front edge 160 of second subplate 150 so as to provide room for mounting linear array 88 to subplate 150 at front edge 160. First and second subplates are soldered together with solder 161 such as indium or gold-tin alloy. Typically, plate 144 is 1 cm by 1 cm by 300 microns with subplates 148 and 150 each being generally rectangular and about 150 microns thick. First plate 148 is notched at front edge 158 to provide clearance for wires 78. Plate 146 and additional plates not shown are identical to plate 144.

First or spacer subplate 148 is of one electrical conductivity type, i.e. is electrically insulating and may be made, for example, of BeO. A layer 162 of electrically conducting material is applied to part of a top surface 164 of first subplate 148. Layer 162 does not wrap around front edge 158. This keeps layer 162 electrically isolated from second subplate 150. Support subplate 150 is of an electrical conductivity type which is opposite that of spacer subplate 148, i.e. is electrically conducting and may be made, for example, of sintered tungsten-copper alloy. Layer 162, front edge 158 and a front portion 166 of the top surface of second subplate 150 define a top major surface of plate 144. Bottom surface 168 of second subplate 150 defines a bottom major surface of plate 144.

A linear laser array 88 is mounted to the top major surface of plate 144 at front edge 160. Linear laser array 88 is mounted to front portion 160 of second subplate 150 so that second subplate 150 is electrically connected to bottom electrodes of the diode lasers of linear array 88. A plurality of wires 78 electrically connect layer 162 to the top electrodes of linear laser array 88.

The bottom surface 168 of the second subplate 150 of plate 144 is in physical and electrical contact with a layer 170 on the top major surface of plate 146. Similarly, plates of other adjacent subassemblies are in physical and electrical contact with one another. These plates may then be soldered together. Plates 156, 144, 146 and 158 are disposed so that their front edges 172, 160 and 174 are vertically aligned. Linear laser arrays 35, 88 and 90 are similarly vertically aligned.

Laser array 88 makes physical contact with plate 144, to which it is bonded, but not with plate 156. Thus, large mechanical stresses on the array 88 because of heat induced expansion are avoided. Since the top surface of second subplate 150 is substantially planar with no topography, it can be polished by standard means to provide a flat, smooth interface for bonding laser array 88 thereto. The gap between the top of laser array 88 and plate 156 is typically 75 microns, taking wires 78 and conducting layers into account. An accidental short across the gap is unimportant since both sides of the gap are at the same electrical potential.

Preferably, plates 144, 146 and others are heat conducting for removal of waste heat from diode arrays 35, 88 and 90. At least some of the first subplates 148 and 152 extend back beyond the second subplates 150 and 154 to form fins. The rear part of the fins are metallized with layers 176. Breaks 178 in the metallization electrically isolates the fins from the rest of the top and bottom surfaces. This prevents an electrically-conducting heat sink, shown in FIG. 9, from shorting out the subassemblies in stacked configurations.

In FIG. 9, a preferred construction for the present invention, a diode laser assembly comprises a plurality of subassemblies 180, 182 and 184 having linear diode laser arrays 181, 183 and 185 respectively mounted on plates. Although only three subassemblies are shown, the actual number of subassemblies can range from one to about sixty. Thus, the emitting face of the assembly is typically 1 cm by 1-2 cm. The length of the assembly is typically about 1.75 cm.

The entire assembly is electrically contacted by top and bottom mounting plates 186 and 188. Mounting plates 186 and 188 may also serve as primary or supplementary heat sinks. Top and bottom mounting plates may be bolted together and to the rest of the assembly by bolts 190, in the same manner as bolts 22, 24 and 26 in the assembly 10 of FIG. 1. Alternatively, the assembly may be soldered together. Bolts 190 are insulative so as to prevent shorting out the stacked subassemblies. Pins, not shown, maintain the subassemblies 180, 182 and 184 in proper alignment in the same manner as pkns 32 in FIG. 1.

A heat sink block 192 removes heat from subassemblies 180, 182 and 184. Preferably, block 192 is made of material with high heat capacity, such as copper, and has dimensions approximately 0.75 cm by 1.0 cm by 1-2 cm. Insulative bolts 190 insert into holes 194 in block 192 and an insulating plate 196 to hold block 186 in place. Block 192 may also be soldered to lower mounting plate 188. Insulating plate 196 prevents block 192 from shorting the top and bottom contact plates 186 and 188. Subassemblies 180, 182 and 184 have fins 198, 199 and 200 which extend back to heat sink block 192. Fins 198, 199 and 200 remove waste heat by conduction to block 192 and by gas flow between fins. Fins 198, 199 and 200 may be soldered to block 192 for improved heat conduction.

Electrical current flows through the assembly beginning at top contact plate 186. The current passes through the top metallization layer on the first subplate of the top subassembly, through the wires to the linear laser array, through the diode lasers of the array to the second subplate of the subassembly and then to the top metallization layer on the next subassembly. After flowing through all of the subassemblies, the current leaves the second subplate of the bottom subassembly and exits the stack through the bottom mounting plate 188. In this manner, all of the diode lasers of the two-dimensional stacked array are supplied with electrical current.

Heat from each laser diode array 181, 183 and 185 travels along the second subplate to which the array is mounted, spreads into the first subplate and exits the subassembly by way of the rear extension of fins to the heat sink block 192 and flowing air.

In this application reference was made to electrically and thermally conductive materials, as well as electrically insulating materials. In general, those skilled in the art will recognize that electrically and thermally conductive materials are metals, such as copper, aluminum and other well known materials of good conductivity. Electrically insulating materials are generally dielectric materials, such as most BeO, diamond, cubic boron nitride, SiC, polymers, glass, Bakelite and similar materials. Metals coated with thin insulating layers may also be used.

The conductive layers described herein are preferably thin metal foils, only a few microns thick, while the insulative layers are sheet or deposited material, such as thin Mylar layers or a variety of dielectrics, such as $SiO_2$ and $Al_2O_3$. Mylar is a trademark for polymer substrate material. The Mylar layers are a few mils thick. Rather than using foils and films for the various layers, platings, coatings and deposited layers can also be used.

We claim:

1. A diode laser array assembly comprising,
    a plurality of linear diode laser array subassemblies stacked one above another in parallel relation, each of said subassemblies having a support plate with first and second opposed major surfaces, a linear array of diode lasers mounted to a first of said major surfaces at a front edge of said support plate, and an electrically conductive path from said first major surface in parallel via a plurality of wires through said linear array to said second major surface, each of said subassemblies being electrically connected in series to at least one adjacent subassembly, the stacked subassemblies providing clearance between the linear arrays and adjacnet subassemblies, and
    heat conducting path means for removing excess heat from said linear arrays.

2. The laser array assembly of claim 1 wherein said heat conducting path means comprises heat conducting spacer plates between adjacent support plates, at least some of said heat conducting plates extending beyond beyond said support plates to forms fins.

3. The laser array assembly of claim 1 wherein said heat conducting path means comprises heat conducting support plates, an electrically insulating layer over the support plate, and an electrically conducting layer over said insulating layer, at least some of said heat conducting support plates extending beyond others of said support plates to form fins.

4. The laser array assembly of claim 1 wherein said heat conducting path means comprise first and second thermally conducting layers disposed on opposite sides of a portion of thermally conducting support plates, at least some of said thermally conducting support plates extending beyond others of said support plates.

5. The laser array assembly of claim 1 wherein said electrically conductive path of said subassembly comprises,
   a first electrically conductive layer applied to part of said top major surface of said support plate, said support plate being electrically insulating,
   a second electrically conductive layer applied to at least a part of said bottom major surface, said second layer being electrically insulated from said first layer of said subassembly, and
   said plurality of wires bonded in parallel to said diode lasers and to one of said first and second layers.

6. The laser array assembly of claim 1 wherein said electrically conductive path of said subassembly comprises,
   a first electrically conductive layer applied to a part of a surface of said support plate, above an intervening electrically insulating layer disposed over the support plate, the support plate being electrically conductive, said conductive layer being electrically insulated from said support plate, and
   said plurality of wires bonded in parallel to said diode laser array and to said electrically conductive layer.

7. The laser array assembly of claim 1 wherein said subassemblies include an optically transparent waveguide behind said linear array and extending to the rear of said sumbassemblies.

8. The laser array assembly of claim 1 wherein each major surface of said plate is substantially planar and one major surface of said plate is notched at said front edge for allowing clearance for said linear array mounted to said plate of said adjacent subassembly.

9. The laser array of claim 1 wherein said subassemblies are stacked staircase-like, said front edge of said plate of one subassembly being spaced back from said front edge of said electrically insulated plate of the next lower subassembly, the linear arrays of said subassemblies defining a plane at an angle to vertical.

10. The laser array assembly of claim 1 wherein each said support plate has a first electrical conductivity characteristic and each support plate is separated from an adjacent support plate by a spacer palte having an electrical conductivity characteristic opposite said first electrical conductivity characteristic.

11. The laser array assembly of claim 10 wherein said support plate has a further frontal extend than said spacer plate for allowing clearance for said laser array.

12. The laser array assembly of claim 1 wherein said electrically conductive path of said subassembly comprises,
   an electrically conducting layer applied to a potion of an electrically insulating layer, said insulating layer disposed on said support plate said support plate being electrically conductive, said conductive layer being electrically insulated from said support plate, and
   said plurality of wires bonded in parallel to said linear array and to one of said conducting layer and said support plate.

13. A diode laser array assembly comprising,
   a plurality of electrically insulating and heat conducting plates stacked one above another, each of said plates having a first layer of electrically conductive material applied to part of a first major surface of said plate, a linear array of diode lasers mounted to said major surface at a front edge of said plate, a plurality of wires, each wire connecting said first layer to a first electrode of one of said diode lasers, and a second layer of electrically conductive material applied to at least a part of a second major surface of said plate, said second layer being electrically connected to second electrodes of said diode lasers and electrically insulated from said first layer, and
   a plurality of heat- and electrical- conducting spacers disposed between adjacent electrically insulating plates, at least some of said spacers extending beyond said plates to form fins, said spacers electrically connecting said second layer of one adjacent plate to said first layer of the other adjacent plate.

14. A diode laser array assembly comprising,
   a plurality of electrically insulating and heat conducting plates stacked one atop another, each of said plates having a first layer of electrically conductive material applied to a first major surface thereof, said plates having a projection jutting from the front edge of said plate, a linear array of diode lasers mounted to said projection, a plurality of wires connecting said first layer in parallel to a first electrode of said diode lasers, and a second layer of electrically conductive material applied to at least part of a second major surface of said plate, said second layer being electrically connected to second electrodes of said diode lasers for stimulating lasing and electrically insulated from said first layer.

15. The array assembly of claim 14 wherein one of said major surfaces of each said plate is substantially planar.

16. A diode laser array assembly comprising,
   a plurality of electrically insulating and heat conducting plates with opposite first and second major surfaces stacked staircase-like one atop another, a front edge of one plate being spaced back from a front edge of said next lower plate, each of said plates having a first layer of electrically conductive material applied to a first major surface of said plate, a linear array of diode lasers mounted to said first major surface at said front edge of said plate, a plurality of conductive means for connecting said first layer to a first electrode of one of said diode lasers, and a second layer of electrically conductive material applied to at least a part of a second major surface of said plate, said second layer being electrically connected in parallel to second electrodes of said diode lasers and electrically insulated from said first layer.

17. A diode laser array assmbly compirsing,
   a plurality of linear diode laser array subassemblies stacked one above another, each of said subassemblies having interleaved adjacent support and spacer plates, a linear array of diode lasers mounted to said conductive support plates and an electrically conductive path through said linear array, each of said subassemblies being electrically connected to adjaent subassemblies, with an edge of one spacer plate being spaced back from an edge of an adjacent support plate, said spacer plates being electrically insulating and having a layer of electrically conductive material applied to part of a surface thereof, each subassembly having a plurality of conductive means connecting a first electrode of said diode lasers of said linear array to said layer on said spacer plate, said support plate being electrically connected to second electrodes of said diode lasers of said linear array and electrically insulated from said layer on said spacer plate, said conductive path extending from said layer of said spacer plate, through said conductive means, through said linear array of diode lasers to a support plate.

18. The diode laser array assembly of claim 17 wherein some of said support and spacer plates have high thermal conductivity.

19. The diode laser array assembly of claim 17 wherein at least some of said plates extend beyond others of said plates for conducting heat out out of the diode laser array assembly.

20. A diode laser array assembly comprising,
a plurality of linear diode laser array subassemblies stacked one above another in parallel relation, each of said subassemblies having a support plate with first and second opposed major surfaces, a linear array of diode lasers mounted to a first of the major surfaces at a front edge of the support plate, an optically transparent spacer plate disposed behind said linear array between support plates of adjacent subassemblies, and an electrically conductive path from said first major surface through a plurality of conductors connecting in parallel to said linear array, and through said linear array to said second major surface, the spacer plate providing clearance between said linear array and an adjacent subassembly, and
heat conducting path means for removing excess heat from said linear arrays.

* * * * *

UNITED STATES PATENT AND TRADEMARK OFFICE
CERTIFICATE OF CORRECTION

PATENT NO. : 4,716,568

DATED : December 29, 1987

INVENTOR(S) : Donald R. Scifres et al.

It is certified that error appears in the above-identified patent and that said Letters Patent is hereby corrected as shown below:

Column 6, line 11, "purposes" should read - -purposes.- -.

Claim 1, column 8, lines 57-58 "and adjacnet subassemblies" should read - -and adjacent subassemblies- -.

Claim 9, column 9, line 45, "The laser array of claim 1" should read - -The laser array assembly of claim 1- -.

Claim 10, column 9, line 54, "by a spacer palte" should read - -by a spacer plate- -.

Claim 11, column 9, line 58, "has a further frontal extend" should read - -has a further frontal extent- -.

Claim 12, column 9, line 65, "on said support plate said support plate" should read - -on said support plate, said support plate- -.

Claim 17, column 10, line 62, "A diode laser array assmbly compirsing," should read - -A diode laser array assembly comprising,- -.

Claim 17, column 11, line 2, "to adjaent subassemblies" should read - -to adjacent subassemblies- -.

UNITED STATES PATENT AND TRADEMARK OFFICE
CERTIFICATE OF CORRECTION

PATENT NO. : 4,716,568

DATED : December 29, 1987

INVENTOR(S) : Donald R. Scifres et al.

It is certified that error appears in the above-identified patent and that said Letters Patent is hereby corrected as shown below:

Claim 19, column 12, line 1, "for conducting heat out out of" should read -- for conducting heat out of --.

Signed and Sealed this

Nineteenth Day of July, 1988

Attest:

DONALD J. QUIGG

*Attesting Officer*  *Commissioner of Patents and Trademarks*